(12) United States Patent
Wall (10) Patent No.: US 8,966,332 B2
(45) Date of Patent: Feb. 24, 2015

(54) APPARATUS AND METHOD FOR SELF-TESTING A COMPONENT FOR SIGNAL RECOVERY

(71) Applicant: Cortina Systems, Inc., Sunnyvale, CA (US)

(72) Inventor: Brian Wall, Stittsville (CA)

(73) Assignee: Cortina Systems, Inc., Sunnyvale, CA (US)

( * ) Notice: Subject to any disclaimer, the term of this patent is extended or adjusted under 35 U.S.C. 154(b) by 147 days.

(21) Appl. No.: 13/706,887

(22) Filed: Dec. 6, 2012

(65) Prior Publication Data

US 2014/0164861 A1 Jun. 12, 2014

(51) Int. Cl.
*G01R 31/28* (2006.01)
*G01R 31/3187* (2006.01)
*G01R 31/317* (2006.01)

(52) U.S. Cl.
CPC ...... *G01R 31/3187* (2013.01); *G01R 31/31708* (2013.01)
USPC .......................................... 714/733; 714/724

(58) Field of Classification Search
CPC ............................ G01R 31/3187; G11C 29/16
USPC ......... 714/733, 724, 725, 709, 712, 716, 738, 714/744
See application file for complete search history.

(56) References Cited

U.S. PATENT DOCUMENTS

| | | | |
|---|---|---|---|
| 7,571,363 B2 * | 8/2009 | Wallace et al. | 714/724 |
| 7,974,595 B2 * | 7/2011 | Reddy et al. | 455/115.1 |
| 8,184,686 B2 | 5/2012 | Wall | |
| 8,228,972 B2 * | 7/2012 | Tonietto et al. | 375/221 |
| 8,536,888 B2 * | 9/2013 | Chien et al. | 324/750.3 |

OTHER PUBLICATIONS

IEEE Draft p802.3ap/Draft 2.3, Draft Amendment of: IEEE Standard for Information Technology—Telecommunications and information exchange between systems Local and metropolitan area networks—Specific requirements, Feb. 15, 2006, 205 Pages.

* cited by examiner

*Primary Examiner* — Fritz Alphonse
(74) *Attorney, Agent, or Firm* — Amin, Turocy & Watson, LLP (57) ABSTRACT

A circuit having a component for signal recovery, such as an adaptive equalizer, may be tested in order to ensure that the component operates properly. Unfortunately, external test equipment may be expensive and prone to being damaged. According to an aspect of the disclosure, there is provided a circuit including BIST (Built-in Self-Test) circuitry for testing a component for signal recovery with a stress signal that simulates an imperfect signal received over a communication channel. The circuit also has a detector for determining whether the component is operating properly with the stress signal. Thus, no external test equipment is needed for testing the component. In some implementations, the BIST circuitry includes a low-pass filter for filtering a transmit signal into the stress signal. Thus, the amount of circuitry involved in generating the stress signal can be reduced.

18 Claims, 6 Drawing Sheets

APPARATUS AND METHOD FOR SELF-TESTING A COMPONENT FOR SIGNAL RECOVERY

FIELD OF THE DISCLOSURE

The disclosure relates to communication systems, and more particularly to recovering data received over a communication channel.

BACKGROUND

In the past, a motivation for deploying multimode fibre was its cheaper cost by comparison with single mode fibre. Unfortunately, multimode fibre has disadvantages over single mode fibre. In particular, signals traversing a multimode fibre will be dispersed or separated into a number of modes. Unfortunately, depending on the length of the multimode fibre, each mode may arrive at the destination at slightly different times. A receiver should compensate for this. Furthermore, the receiver should compensate for ISI (Inter-Symbol Interference) found in the received signal.

Recovering data received over a multimode fibre is accomplished using appropriate timing recovery. Many existing timing recovery circuits use a PLL (Phase Lock loop) to determine a proper sampling point. However, as data rates increase, existing timing recovery circuits are no longer adequate for properly recovering data received over multimode fibre. Adaptive equalization with appropriate timing recovery circuits can be used. An entire study group during the 802.3aq standard was involved in characterizing this problem.

Adaptive equalization can be an effective approach for recovering data received over multimode fibre. Additionally, adaptive equalization can be an effective approach for recovering data received over other types of communication channels such as long connections of a PCB (Printed Circuit Board) for example.

BRIEF DESCRIPTION OF THE DRAWINGS

Embodiments of the disclosure will now be described with reference to the attached drawings in which.

DETAILED DESCRIPTION OF EMBODIMENTS

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A circuit having a component for signal recovery, such as an adaptive equalizer, may be tested in order to ensure that the component operates properly. Such testing may be performed because proper operation is subject to a variety of challenges introduced by analog components. One approach is to use external test equipment to generate an input signal for the component and to observe how the component reacts. However, external test equipment may be expensive and prone to being damaged in a harsh ATE (Automated Test Equipment) environment. Also, it may be difficult or impractical to use external test equipment in some situations such as when the circuit is tested in the field. Note that the circuit may be tested in the field to help isolate where a problem may be occurring in a system and it is not known if the problem is with the circuit or with some other component in the system.

According to an aspect of the disclosure, there is provided a circuit including BIST (Built-in Self-Test) circuitry for testing a component for signal recovery with a stress signal that simulates an imperfect signal received over a communication channel. The circuit also has a detector for determining whether the component is operating properly with the stress signal. Thus, no external test equipment is needed for testing the component. In some implementations, the BIST circuitry includes a low-pass filter for filtering a transmit signal into the stress signal. Thus, the amount of circuitry involved in generating the stress signal can be reduced.

Other aspects and features of the present disclosure will become apparent, to those ordinarily skilled in the art, upon review of the following description of the specific embodiments of the invention.

BIST Circuitry for Testing a Component

Figure 1:
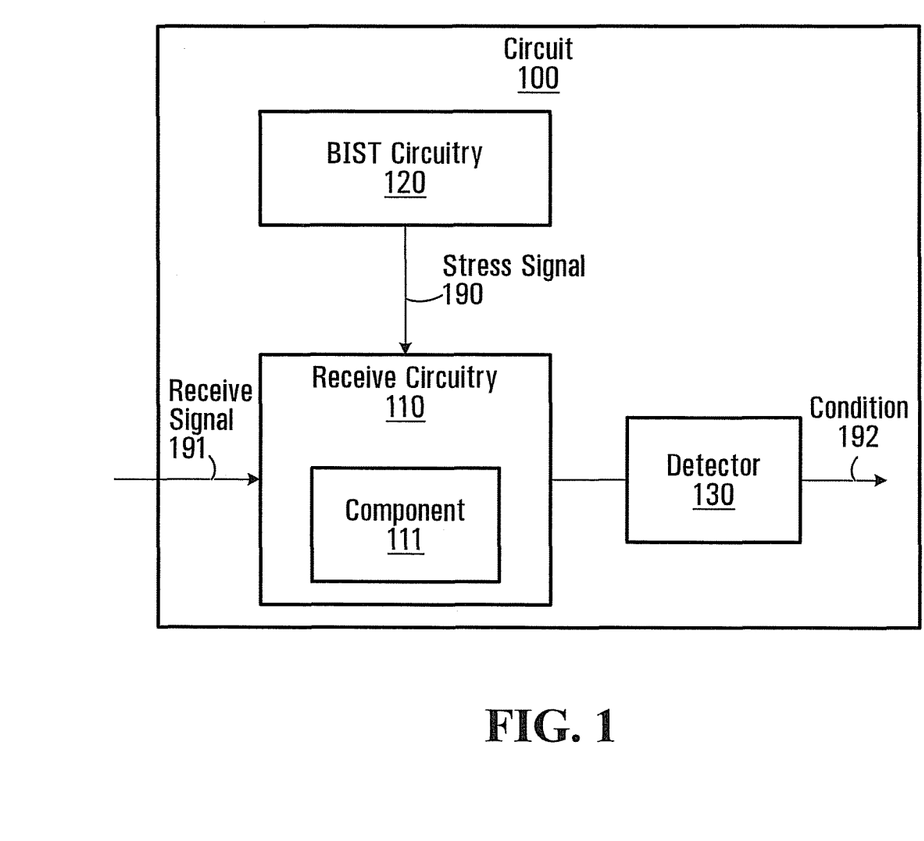
FIG. 1 is a block diagram of a circuit with BIST (Built-in Self-Test) circuitry for testing a component used for signal recovery.

Referring first to FIG. 1, shown is a block diagram of a circuit 100 with BIST circuitry 120 for testing a component 111 used for signal recovery. The circuit 100 has receive circuitry 110 including the component 111 used for signal recovery, the BIST circuitry 120, and a detector 130. The circuit 100 may have other components, but they are not shown for sake of simplicity.

The operation of the circuit 100 will now be described by way of example. The receive circuitry 110 can receive and process a receive signal 191. The receive signal 191 might for example be received over a communication channel (not shown) that introduces at least one defect such as ISI (Inter-Symbol Interference). In order to accommodate for this, the receive circuitry 110 includes the component 111 for signal recovery.

The circuit 100 might be tested in order to ensure that the component 111 operates properly. Unfortunately, as already stated, external test equipment may be expensive and prone to being damaged. According to an aspect of the disclosure, the BIST circuitry 120 tests the component 111 with a stress signal 190 that simulates an imperfect signal received over a communication channel. Thus, no external test equipment is needed for testing the component 111. Thus, during testing, there may be less hardware to be damaged, less hardware to be calibrated, etc. Note that BIST circuitry 120 is "built-in" in the sense that it permanently forms part of the circuit 100. For example, the BIST circuitry 120 may be on the same chip (e.g. same silicon) as the rest of the circuit 100, or otherwise permanently fixed.

In some implementations, the circuit 100 has a multiplexer (not shown) for selecting between the receive signal 191 and the stress signal 190. Examples of this are provided below with reference to FIGS. 2 and 3. In alternative implementations, the receive circuitry 110 receives both the receive signal 191 and the stress signal 190, but processes only one of them based on whether the receive circuitry 110 is in a receive state or a test state. Thus, the multiplexer is not required. Other implementations are possible.

The detector 130 determines whether the component 111 is operating properly with the stress signal 190. More generally, the detector 130 determines at least one condition 192 that is indicative of whether the component 111 is operating properly with the stress signal. There are many possibilities for such condition 192, some of which will be described in further detail with reference to the subsequent Figures.

There are many possibilities for the component 111 used for signal recovery. In some implementations, the component 111 is an adaptive equalizer (e.g. backplane or cable equalizer). Examples of this are described in further detail below with reference to FIGS. 2 and 3. In alternative implementations, the component 111 is a non-adaptive equalizer, or a fixed filter designed to compensate for ISI. Such alternative implementations are not adaptive to varying ISI conditions.

In some implementations in which the circuit 100 includes transmit circuitry (not shown) for generating a transmit signal, the BIST circuitry 120 is configured for transforming the transmit signal into the stress signal 190. In such implementations, the BIST circuitry 120 makes use of existing circuitry, namely the transmit circuitry. Thus, the amount of additional circuitry involved in generating the stress signal 190 can be reduced. The BIST circuitry 120 might for example transform the transmit signal into the stress signal 190 using a filter and/or a noise generator. Examples of this are described in further detail below with reference to the subsequent Figures. In alternative implementations, the BIST circuitry 120 includes dedicated hardware (not shown) for generating the stress signal 190 from scratch and does not make use of any transmit circuitry. Other implementations are possible.

More generally, the BIST circuitry 120 can include any appropriate circuitry to generate the stress signal 190 that simulates an imperfect signal received over a communication channel. The so-called imperfect signal is "imperfect" in the sense that it has at least one defect from transmission over a communication channel. In some implementations, the at least one defect includes ISI caused by frequency-dependent attenuation of frequencies (e.g. high frequencies) from transmission over a communication channel. In some implementations, the at least one defect includes noise as may be introduced from transmission over a communication channel. Other possible defects may include multipath interference, channel non-linearity's, reflections, etc. In some implementations, the at least one defect includes multiple defects such as both ISI and noise.

BIST Circuitry for Testing an Adaptive Equalizer

Figure 2:
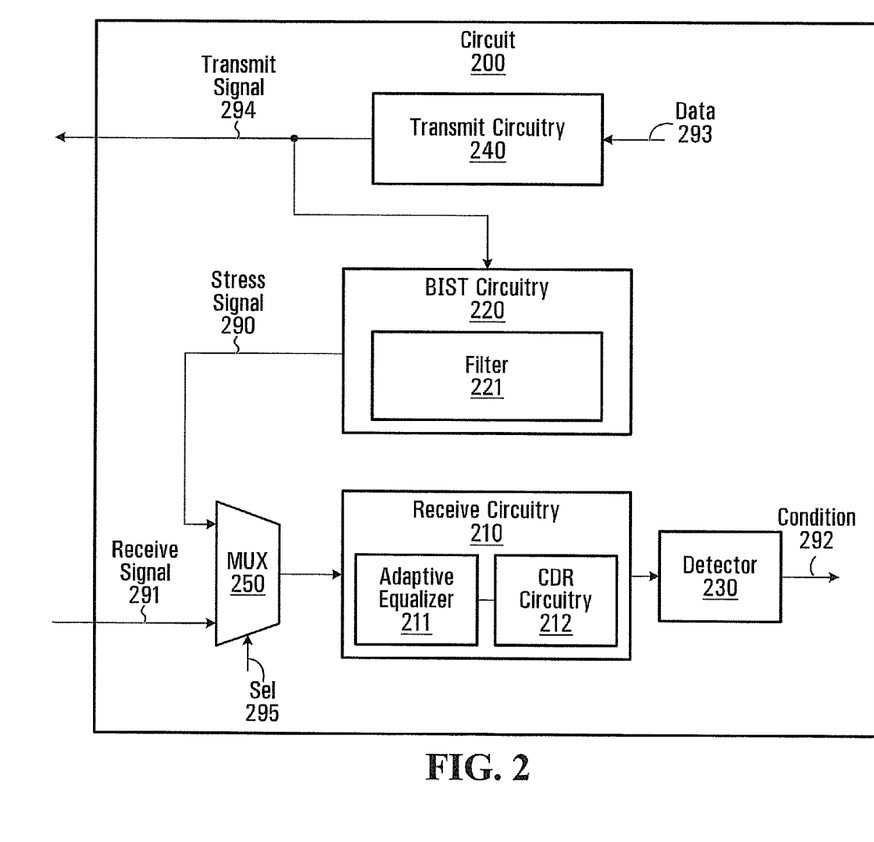
FIG. 2 is a block diagram of a circuit with BIST circuitry for testing an adaptive equalizer.

Referring now to FIG. 2, shown is a block diagram of a circuit 200 with BIST circuitry 220 for testing an adaptive equalizer 211. The circuit 200 has transmit circuitry 240, and receive circuitry 210 including the adaptive equalizer 211 and CDR (Clock and Data Recovery) circuitry 212. The circuit 200 also has the BIST circuitry 220 for testing the adaptive equalizer 211, a detector 230, and a multiplexer 250. The circuit 200 may have other components, but they are not shown for sake of simplicity.

The operation of the circuit 200 will now be described by way of example. The transmit circuitry 240 can generate a transmit signal 294 from data 293. The receive circuitry 210 can receive and process a receive signal 291. The receive signal 291 might for example be received over a communication channel (not shown) that introduces at least one defect such as ISI. In order to accommodate for this, the receive circuitry 210 includes the adaptive equalizer 211 for signal recovery. The receive circuitry 210 also includes the CDR circuitry 212 for sampling the recovered signal.

The circuit 200 might be tested in order to ensure that the adaptive equalizer 211 operates properly. Unfortunately, as already stated, external test equipment may be expensive and prone to being damaged or otherwise impractical. According to an aspect of the disclosure, the BIST circuitry 220 tests the adaptive equalizer 211 with a stress signal 290 that simulates an imperfect signal received over a communication channel. Thus, no external test equipment is needed for testing the adaptive equalizer 211.

The multiplexer 250 provides the stress signal 290 to the receive circuitry 210 when the stress signal 290 has been selected via a select signal 295. This would be done when testing the adaptive equalizer 211 (e.g. while the transmit circuitry 240 and the receive circuitry 210 are running at probe test). Conversely, the multiplexer 250 provides the receive signal 291 to the receive circuitry 210 when the receive signal 291 has been selected. This would be done when the adaptive equalizer 211 is not being tested. Thus, the multiplexer 250 operates to select one of the two signals 290,291 as an input for the receive circuitry 210, depending on whether the adaptive equalizer 211 is being tested.

In alternative implementations, the multiplexer 250 selects a non-stressed signal that originates from somewhere in the transmit path (e.g. the transmit signal 294). However, such alternative implementations do not actually stress the adaptive equalizer 211, as the non-stressed signal does not simulate an imperfect signal received over a communication channel. Thus, using a stressed signal is better suited for testing the adaptive equalizer 211.

The detector 230 determines whether the adaptive equalizer 211 is operating properly with the stress signal 290. More generally, the detector 230 determines at least one condition 292 that is indicative of whether the adaptive equalizer 211 is operating properly with the stress signal 290. There are many possibilities for such condition 192.

In some implementations, the condition 292 is whether recovered data from the CDR circuitry 212 matches original data 293 from the transmit signal 294. A match suggests that the adaptive equalizer 211 is operating properly, and also suggests that the transmit circuitry 240 and the CDR circuitry 212 are operating properly. Thus, indirectly, the transmit circuitry 240 and the CDR circuitry 212 may also be tested. No match may indicate that the adaptive equalizer 211 is not operating properly.

In alternative implementations, the condition 292 is whether the adaptive equalizer 211 has coefficients that are suitable given the stress signal 290. In other words, the condition 292 is whether the adaptive equalizer 211 has adapted in a suitable manner in light of the stress signal 290. Details of the coefficients and how they are adapted will be described in further detail with reference to FIG. 3.

In the illustrated example, the BIST circuitry 220 includes a filter 221 in a loopback path from the transmit circuitry 240 to the receive circuitry 210. The filter 221 transforms the transmit signal 294 into the stress signal 290 via filtering. In this manner, the BIST circuitry 220 makes use of existing circuitry, namely the transmit circuitry 240. Thus, the amount of additional circuitry involved in generating the stress signal 290 can be reduced. In some implementations, the BIST circuitry 220 also includes a noise generator, an example of which will be described in further detail with reference to FIG. 6. More generally, the BIST circuitry 220 can include any appropriate circuitry to generate the stress signal 290 that simulates an imperfect signal received over a communication channel.

There are many possibilities for the filter 221. In some implementations, the filter 221 is a low-pass filter configured to attenuate high frequencies in the transmit signal 294. In alternative implementations, the filter 221 is a high-pass filter configured to attenuate low frequencies in the transmit signal 294, or a band-pass filter configured to attenuate low and high frequencies in the transmit signal 294. In some implementations, the filter 221 is an analog filter, an example of which will be described in further detail with reference to FIG. 4. In other implementations, the filter 221 is a digital filter, an example of which will be described in further detail with reference to FIG. 5. In some implementations, the filter 221 is programmable to different configurations for varying the stress signal 290. Other implementations are possible.

BIST Circuitry for Testing an Adaptive Equalizer Having FFE & DFE

Figure 3:
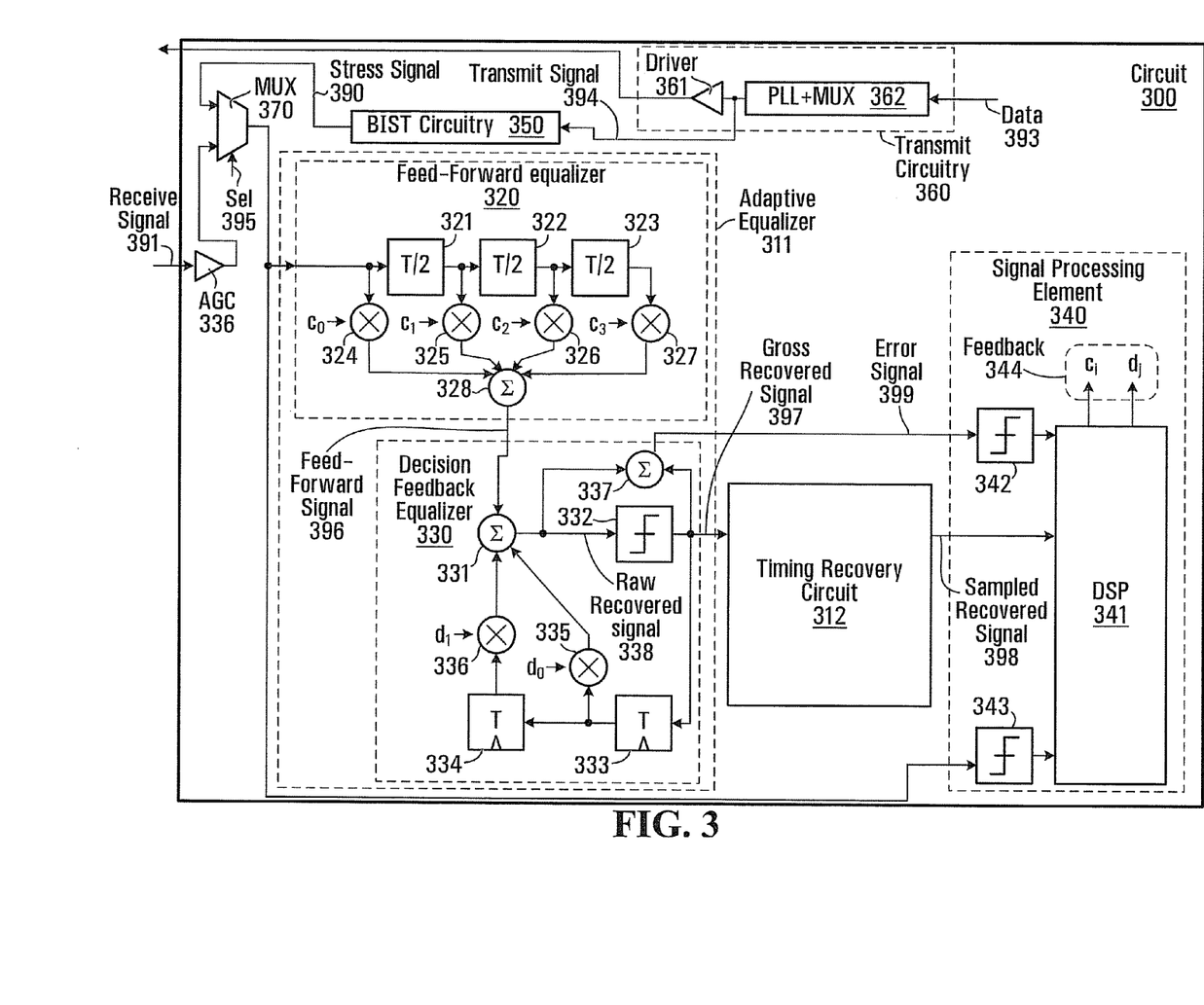
FIG. 3 is a block diagram of a circuit with BIST circuitry for testing an adaptive equalizer having a feed-forward equalizer and a decision feedback equalizer.

Referring now to FIG. 3, shown is a block diagram of a circuit 300 with BIST circuitry 350 for testing an adaptive equalizer 311 having a feed-forward equalizer 320 and a decision feedback equalizer 330. The circuit 300 has transmit circuitry 360, and receive circuitry including the adaptive equalizer 311 and a timing recovery circuit 312. The circuit 200 also has the BIST circuitry 350 for testing the adaptive equalizer 311, a signal processing element 340, and a multiplexer 370. In some implementations, there are signal conditioning components, for example an AGC (Automatic Gain Control) 336 for adjusting a receive signal 391 to an appropriate range for the adaptive equalizer 311. The circuit 300 may have other components, but they are not shown for sake of simplicity. It is to be understood that the circuit 300 is shown with a very specific arrangement of components and is for exemplary purposes only.

The operation of the circuit 300 will now be described by way of example. The transmit circuitry 360 has a PLL (Phase locked Loop) and MUX (Multiplexer) 362 for generating a transmit signal 394 from data 393. The transmit circuitry 360 also has a driver 361 for amplifying the transmit signal 394 for transmission. The receive circuitry can receive and process a receive signal 391. The receive signal 391 might for example be received over a communication channel (not shown) that introduces at least one defect such as ISI. In order to accommodate for the ISI, the receive circuitry includes the adaptive equalizer 311 for signal recovery. The receive circuitry also includes the timing recovery circuit 312 for sampling the recovered signal 397.

The circuit 300 might be tested in order to ensure that the adaptive equalizer 311 operates properly. Unfortunately, as already stated, external test equipment may be expensive and prone to being damaged or otherwise impractical. According to an aspect of the disclosure, the BIST circuitry 350 tests the adaptive equalizer 311 with a stress signal 390 that simulates an imperfect signal received over a communication channel. Thus, no external test equipment is needed for testing the adaptive equalizer 311. The multiplexer 370 provides the stress signal 390 to the receive circuitry when the stress signal 390 has been selected via a select signal 295.

The adaptive equalizer 311, the timing recovery circuit 312, and the signal processing element 344 operate in a similar manner as the adaptive equalizer 211, the CDR circuitry 212, and the detector 230, respectively, as shown in FIG. 2. However, the signal processing element 340 is shown to have a DSP (Digital Signal Processor) 341 generating feedback 344 in the form of a first set of coefficients $c_i$ for the feed-forward equalizer 320 and a second set of coefficients $d_j$ for the decision feedback equalizer 330. The coefficients $c_i,d_j$ are generated based on an error signal 399 such that the adaptive equalizer 211 can adapt to minimize or reduce error.

The signal processing element 340 determines whether the adaptive equalizer 311 is operating properly with the stress signal 390. More generally, the signal processing element 340 determines at least one condition that is indicative of whether the adaptive equalizer 311 is operating properly with the stress signal 390. There are many possibilities for such condition. In some implementations, the condition is whether recovered data from the timing recovery circuit 312 matches original data 393 from the transmit signal 394. This might for example involve digital logic comparing the data 393 to the recovered signal 398. Such digital logic may be part of the DSP 341 or separate from the DSP 341 (e.g. dedicated hardware). In alternative implementations, the condition is whether the adaptive equalizer 311 has coefficients $c_i,d_j$ that are understood to be suitable (i.e. the adaptive equalizer 311 has adapted in a manner that is understood to be appropriate given the stress signal 390). This might for example involve circuitry to check if the coefficients $c_i,d_j$ are within some expected operating range. Such circuitry may be part of the DSP 341, and may be controlled via software that looks at the coefficients $c_i,d_j$ that are computed by the DSP 341 and determines if they are within some acceptable range. The software could reside in the DSP 341 or form part of some external software program. Other implementations are possible.

In the illustrated example, the DSP 340 implements an algorithm based on the LMS (Least Mean Square) algorithm for minimizing or reducing the error signal 399 by dynamically adjusting the first set of coefficients and the second set of coefficients. The second set of coefficients are updated based on past values of the second set of coefficients according to $$d_{jT+1}=d_{jT}+(\mu \cdot \text{sign}(\epsilon_T) \cdot \text{sign}(\text{data}_{T-j})), \quad [1]$$

where $\mu$ is a number between 0 and 1, $\epsilon_T$ is the error signal 94, and $\text{data}_{T-j}$ is the sampled recovered signal 398. In the illustrated example, the threshold element 342 implements the sign function for the error signal 399 while the timing recovery circuit 312 implements the sign function for the sampled recovered signal 398. The first set of coefficients are similarly updated based on past values for the first set of coefficients according to $$c_{iT+1}=c_{iT}+(\mu \cdot \text{sign}(\epsilon_T) \cdot \text{sign}(x_{T-i})), \quad [2]$$

where x is the receive signal 391. In the illustrated example, the threshold element 343 implements the sign function for the receive signal 391.

The equations above use sign functions, which differ from the traditional LMS algorithm. Implementing sign functions, which have only two possible logical outputs, simplifies computation for the DSP 340. However, in other implementations, other types of DACs (Digital to Analog Converters) with more than two possible logical outputs may be implemented so that the DSP 341 may perform computation with many possible discrete values for signals such as the error signal 399 or the receive signal 391.

There are many operating conditions for the DSP 341. In specific implementations, the DSP 341 is parallelized to operate at $\frac{1}{32}$ times 10 GHz. However, more generally, the DSP 341 may operate under any suitable conditions for computing the first set of coefficients and the second set of coefficients.

Referring now to the feed-forward equalizer 320, there are three analog delay elements 321,322,323, four multipliers 324,325,326,327 including a first multiplier 324 and three additional multipliers 325,326,327, and a summation element 328. The feed-forward equalizer 320 may have other components, but they are not shown for sake of simplicity.

In operation, the three analog delay elements 321,322,323 generate three time-delayed signals from the receive signal 391. The first multiplier 324 generates a first multiplied signal by multiplying the receive signal 391 with a first coefficient, $c_0$, of the first set of coefficients, $c_i$. Each additional multiplier 325,326,327 generates a respective multiplied signal by multiplying a respective one of the time-delayed signals with a respective one of the first set of coefficients, $c_i$. The summation element 328 generates the feed-forward signal 396 by summing the first multiplied signal with each respective multiplied signal.

It is to be understood that the feed-forward equalizer 320 is shown with a very specific arrangement of components and that other implementations are possible. Although three analog delay elements 321,322,323 and four multipliers 324,325, 326,327 are shown, more generally, any appropriate number of analog delay elements and multipliers may be implemented. For example, in another implementation, the feed-forward equalizer 320 has one analog delay element and two multipliers. In other implementations, the feed-forward equalizer is provided with more analog delay elements and more multipliers than that shown. Other implementations are possible.

In the illustrated example, each analog delay element 321, 322,323 is a fractional analog delay element. Accordingly, the feed-forward equalizer 320 is a fractional feed-forward equalizer. However, in other implementations, the analog delay elements 320 are baud rate or baud period delay elements in which case the feed-forward equalizer 320 is a baud rate feed-forward equalizer.

Referring now to the decision feedback equalizer 330, there is a first summation element 331, a threshold element 332, two clocked flip-flops 334,334, two multipliers 335,336, and a second summation element 337. The decision feedback equalizer 330 may have other components, but they are not shown for sake of simplicity.

In operation, the first summation element 331 generates a raw recovered signal 338 by summing the feed-forward signal 396 with each of two multiplied signals. The threshold element 332 thresholds the raw recovered signal 338 thereby generating the gross recovered signal 397. The two clocked flip-flops 333,334 generate two time-delayed signals from the gross recovered signal 397. Each multiplier 335,336 generates a respective one of the two multiplied signals by multiplying a respective one of the two time-delayed signals with a respective one of the second set of coefficients, $d_j$. The second summation element 337 generates the error signal 399 by summing the raw recovered signal 338 with the gross recovered signal 397. Other implementations of the error signal are possible.

It is to be understood that the decision feedback equalizer 330 is shown with a very specific arrangement of components and that other implementations are possible. Although two clocked flip-flops 333,334 and two multipliers 335,336 are shown, more generally, any appropriate number of clocked flip-flops and multipliers may be implemented. For example, in another implementation, the decision feedback equalizer 330 has one clocked flip-flop and one multiplier. In other implementations, the decision feedback equalizer 330 is provided with more clocked flip-flops and more multipliers than that shown. Other implementations are possible.

Further example details of adaptive equalizers and timing recovery circuits are provided in U.S. Pat. No. 8,184,686, the entire disclosure of which is incorporated by reference.

Example Implementations of BIST Circuitry

As noted above, there are many possibilities for the BIST circuitry. In general, any appropriate circuitry that can test a component (e.g. adaptive equalizer) used for signal recovery with a stress signal that simulates an imperfect signal received over a communication channel can be utilized. Example implementations are provided in this section. It is to be understood that such example implementations are very specific for exemplary purposes only. Implementations other than those specifically depicted in this section are possible and are within the scope of the disclosure.

Figure 4:
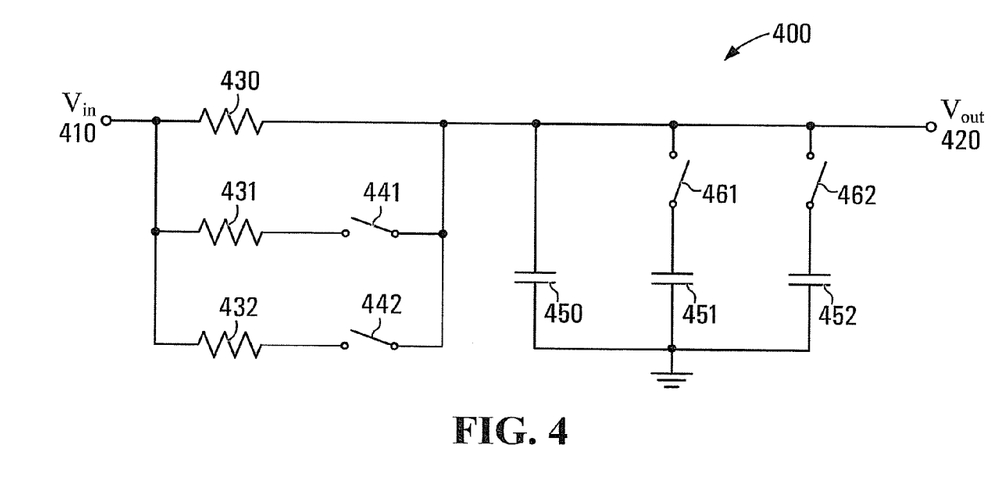
FIG. 4 is a block diagram of an analog filter.

In some implementations, as noted above, the BIST circuitry includes an analog filter. FIG. 4 shows a block diagram of an analog filter 400 for exemplary purposes. The analog filter 400 is a low-pass filter configured to attenuate high frequencies from an input 410 to an output 420. Such attenuation is accomplished with a resistor 430 and a capacitor 450, and is configurable by selectively enabling or disabling additional resistors 431,432 and capacitors 451,452 via respective switches 441,432; 461,462. Enabling more resistors 431,432 has the effect of reducing net resistance, while enabling more capacitors 451,452 has the effect of increasing net capacitance. Thus, the analog filter 400 can be configured to have a desired cut-off frequency of $$f_C = \frac{1}{2\pi \cdot RC}, \qquad [3]$$

where R is the net resistance and C is the net capacitance. In some implementations, the cut-off frequency is programmable, for example by programming whether the switches 441,432; 461,462 are open or closed.

Figure 5:
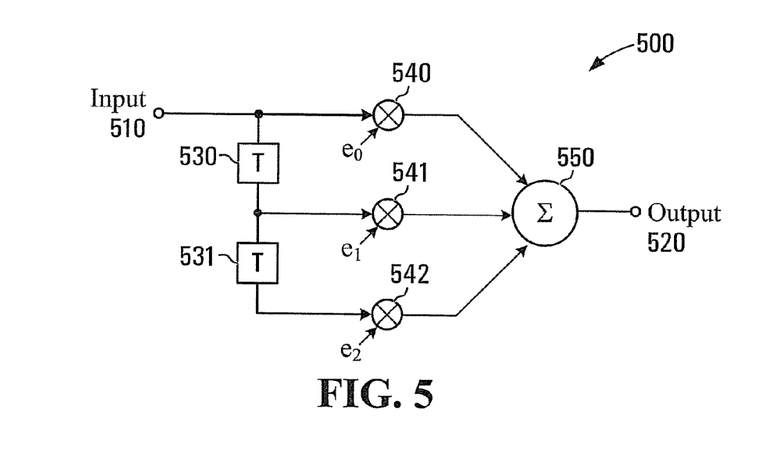
FIG. 5 is a block diagram of a digital filter.

In other implementations, as noted above, the BIST circuitry includes a digital filter. FIG. 5 shows a block diagram of a digital filter 500 for exemplary purposes. The digital filter 500 can be configured as a low-pass filter that attenuates high frequencies from an input 510 to an output 520, or as some other transfer function. The digital filter 500 has delay elements 530,531 and multipliers 540,541,542, and is configurable by selectively setting coefficients $e_o,e_1,e_2$ for the multipliers 540,541,542. A summation unit 550 is coupled to the multipliers 540,541,542 to produce a weighted sum depending on the coefficients $e_o,e_1,e_2$. In some implementations, the coefficients $e_o,e_1,e_2$ are programmable.

In some implementations, the digital filter 500 is configured to emulate a communication channel (e.g. multimode fibre). This may involve frequency-dependent attenuation of frequencies (e.g. high frequencies). For such implementations, the delay elements 530,531 do not need to be baud rate delays, as they may instead be fractional delay elements. Note that a potential benefit of digital filters is that they may be less variable than analog filters. Thus, the digital filter 500 of FIG. 5 may be better suited for emulating a communication channel than the analog filter 400 of FIG. 4.

Figure 6:
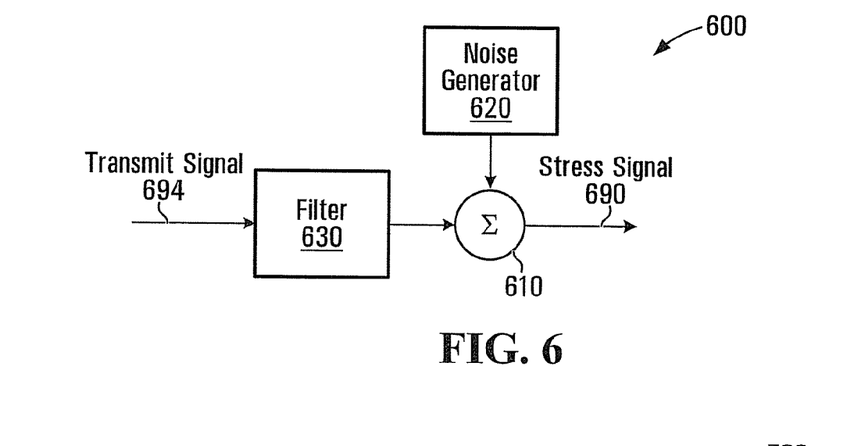
FIG. 6 is a block diagram of BIST circuitry featuring a filter and a noise generator.

In some implementations, as noted above, the BIST circuitry also includes a noise generator. FIG. 6 shows is a block diagram of BIST circuitry 600 featuring a filter 630 and a noise generator 620 for exemplary purposes. The filter 630 functions to generate a stress signal 690 by filtering a transmit signal 694 from transmit circuitry (not shown) as similarly described earlier. The filter 630 can be any suitable filter, examples of which have already been provided and are not repeated here. The BIST circuitry 600 includes a summation unit 610 that functions to introduce noise from the noise generator 620 into the stress signal 690. Thus, the transmit signal 694 is transformed into the stress signal 690 by filtering the transmit signal 694 and by introducing noise.

There are many possibilities for the noise generator. In some implementations, the noise generator is a PRBS (Pseudo-Random Binary Sequence) generator. In some implementations, the noise generator includes a resistor and an amplifier. Other implementations are possible. More generally, any suitable noise generator can be employed. In some implementations, the noise generator 620 introduces enough noise to reduce SNR (Signal to Noise Ratio) to a predefined level. In some implementations, the noise generator 620 is programmable for varying noise in the stress signal 690. Thus, the stress signal 690 can be varied in order to test the component (e.g. adaptive equalizer) used for signal recovery in a variety of ways.

A combination of filtering and noise introduction can help to better simulate an imperfect signal received over a communication channel. However, in alternative implementations, the BIST circuitry has a noise generator and no filter. There may be some scenarios in which it is desirable to have only a noise generator, and other situations in which it is desirable to have only a filter. Also, there may be some scenarios in which it is desirable to have both a filter and a noise generator. Since there are many possibilities for the filter and the noise generator, there are numerous possibilities for the transformation from the transmit signal to the stress signal.

Figure 7:
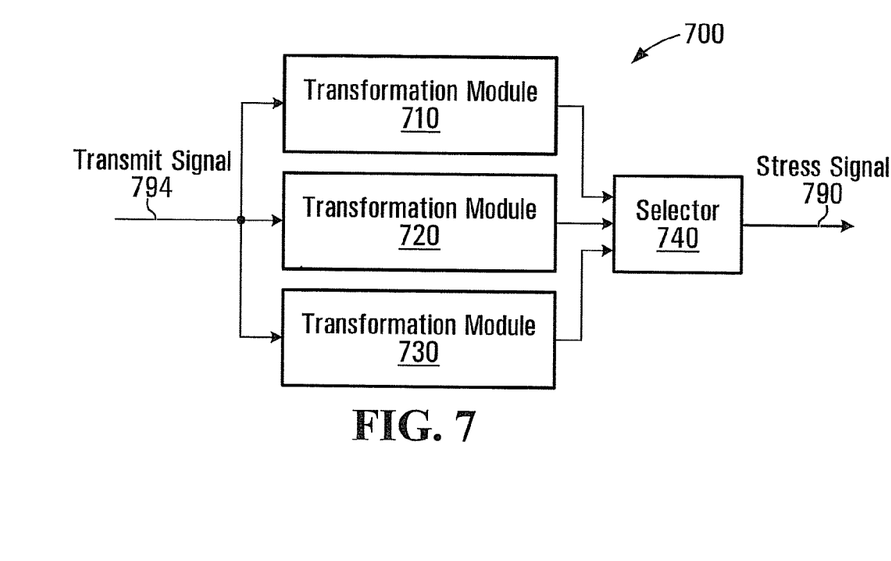
FIG. 7 is a block diagram of BIST circuitry featuring transformation modules.

In some implementations, the BIST circuitry includes transformation modules in order to cover different possibilities for the transformation from the transmit signal to the stress signal. FIG. 7 shows a block diagram of BIST circuitry 700 featuring transformation modules 710,720,730 for exemplary purposes. In some implementations, each transformation module 710,720,730 includes a filter and/or a noise generator. More generally, each transformation module 710,720, 730 has any appropriate circuitry for transforming a transmit signal 794 into a stress signal 790 that simulates an imperfect signal received over a communication channel. The BIST circuitry 700 also has a selector 740 for selecting one of the transformation modules 710,720,730 to transform the transmit signal 794 into the stress signal 790. The transformation modules 710,720,730 can vary in configuration thereby allowing different possibilities for the stress signal 790 even when the same transmit signal 794 is used.

Method for Testing a Component

Figure 8:
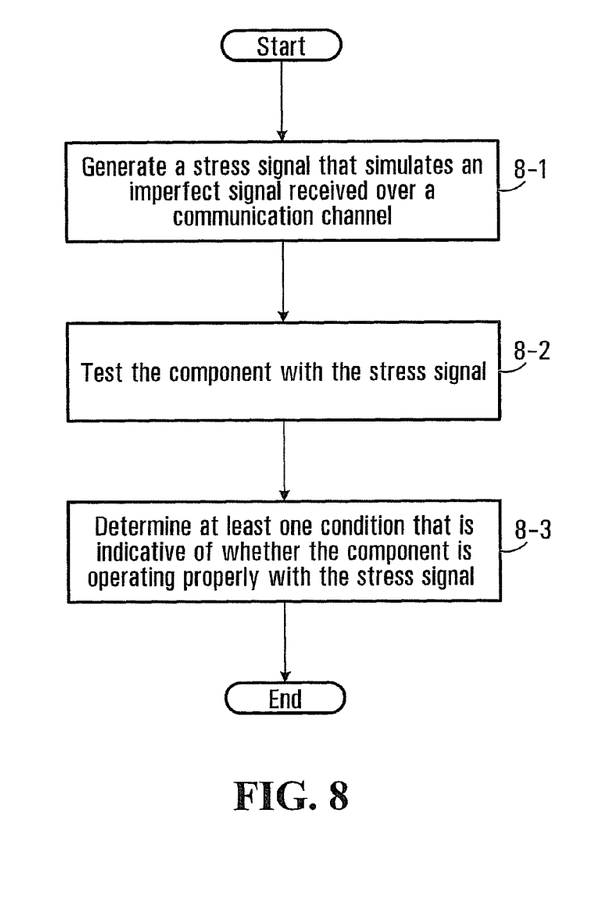
FIG. 8 is a flowchart of a method for testing a component used for signal recovery.

Referring now to FIG. 8, shown is a flowchart of a method for testing a component used for signal recovery. This method may be implemented by a circuit, for example by the circuit 100 shown in FIG. 1, the circuit 200 shown in FIG. 2, or the circuit 300 shown in FIG. 3. More generally, this method may be implemented by any appropriately configured circuit having receive circuitry with a component (e.g. adaptive equalizer) for signal recovery, and BIST circuitry for testing the component.

At step 8-1, the BIST circuitry generates a stress signal that simulates an imperfect signal received over a communication channel. In some implementations in which the circuit includes transmit circuitry for generating a transmit signal, the BIST circuitry is configured for transforming (e.g. filtering) the transmit signal into the stress signal. Examples of how this might be accomplished as well as alternative implementations have already been provided and are not repeated here.

At step 8-2, the BIST circuitry tests the component with the stress signal. Finally, at step 8-3, the circuit determines at least one condition that is indicative of whether the component is operating properly with the stress signal. In some implementations, the condition is whether recovered data matches original data from the transmit signal. Examples of how this might be accomplished as well as alternative implementations have already been provided and are not repeated here.

Numerous modifications and variations of the present disclosure are possible in light of the above teachings. It is therefore to be understood that within the scope of the appended claims, the disclosure may be practiced otherwise than as specifically described herein.

I claim:

1. A circuit comprising:

receive circuitry comprising a component configured for signal recovery;

BIST (Built-in Self-Test) circuitry configured for testing the component with a stress signal that simulates an imperfect signal received over a communication channel; and a detector configured for determining at least one condition indicative of whether the component is operating properly with the stress signal;

wherein:

the circuit further comprises transmit circuitry configured for generating a transmit signal;

the BIST circuitry comprises a filter; and the BIST circuitry is configured to transform the transmit signal into the stress signal by filtering the transmit signal with the filter.

2. The circuit of claim 1, wherein the component configured for signal recovery is an adaptive equalizer.

3. The circuit of claim 2, wherein:

the receive circuitry further comprises CDR (Clock and Data Recovery) circuitry configured for data recovery following the signal recovery by the adaptive equalizer; and the at least one condition indicative of whether the adaptive equalizer is operating properly comprises whether recovered data from the CDR circuitry matches original data from the transmit signal.

4. The circuit of claim 1, wherein the filter is a low-pass filter configured to attenuate high frequencies in the transmit signal.

5. The circuit of claim 1, wherein the filter is an analog filter.

6. The circuit of claim 1, wherein the filter is a digital filter.

7. The circuit of claim 1, wherein the filter is programmable to different configurations for varying the stress signal.

8. The circuit of claim 1, wherein the component configured for signal recovery is a non-adaptive equalizer or a fixed filter designed to compensate for ISI (Inter-Symbol Interference).

9. A circuit comprising:

receive circuitry comprising a component configured for signal recovery;

BIST (Built-in Self-Test) circuitry configured for testing the component with a stress signal that simulates an imperfect signal received over a communication channel; and a detector configured for determining at least one condition indicative of whether the component is operating properly with the stress signal;

wherein:

the circuit further comprises transmit circuitry configured for generating a transmit signal;

the BIST circuitry comprises a noise generator; and the BIST circuitry is configured to transform the transmit signal into the stress signal by introducing noise into the transmit signal with the noise generator.

10. The circuit of claim 9, wherein:
the noise generator is configured to reduce SNR (Signal to Noise Ratio) to a predefined level.

11. The circuit of claim 9, wherein:
the noise generator is programmable for varying noise in the stress signal.

12. A circuit comprising:
receive circuitry comprising a component configured for signal recovery;
BIST (Built-in Self-Test) circuitry configured for testing the component with a stress signal that simulates an imperfect signal received over a communication channel; and
a detector configured for determining at least one condition indicative of whether the component is operating properly with the stress signal;
wherein the circuit further comprises transmit circuitry configured for generating a transmit signal; and
wherein the BIST circuitry comprises:
a plurality of transformation modules each configured to transform the transmit signal into the stress signal; and
a selector configured to select one of the transformation modules to generate the stress signal for the component.

13. The circuit of claim 12, wherein each transformation module comprises at least one of (i) a filter and (ii) a noise generator.

14. The circuit of claim 12, wherein the transformation modules vary in configuration thereby allowing different possibilities for the stress signal.

15. A circuit comprising:
receive circuitry comprising a component configured for signal recovery;
BIST (Built-in Self-Test) circuitry configured for testing the component with a stress signal that simulates an imperfect signal received over a communication channel;
a detector configured for determining at least one condition indicative of whether the component is operating properly with the stress signal; and
a multiplexer configured to (i) provide the stress signal to the receive circuitry when the stress signal has been selected and (ii) provide a receive signal to the receive circuitry when the receive signal has been selected.

16. The circuit of claim 15, further comprising:
transmit circuitry configured for generating a transmit signal;
wherein the BIST circuitry is configured to transform the transmit signal into the stress signal.

17. A method for execution by a circuit comprising receive circuitry with a component configured for signal recovery, the method comprising:
generating a transmit signal;
BIST (Built-in Self-Test) circuitry transforming the transmit signal into a stress signal by filtering the transmit signal, wherein the stress signal simulates an imperfect signal received over a communication channel;
the BIST circuitry testing the component with the stress signal; and
determining at least one condition indicative of whether the component is operating properly with the stress signal.

18. The method of claim 17, wherein filtering the transmit signal comprises attenuating high frequencies in the transmit signal.

* * * * *